United States Patent
Ehlich et al.

(10) Patent No.: US 7,919,946 B2
(45) Date of Patent: Apr. 5, 2011

(54) DETECTION METHOD FOR AN ELECTRICAL POLYPHASE MACHINE

(75) Inventors: Martin Ehlich, Kalletal (DE); Manfred Tinebor, Barntrup (DE); Mario Mueller, Aerzen (DE); Marc Sommer, Aerzen (DE); Thomas Eutebach, Aerzen (DE)

(73) Assignee: Lenze Automation GmbH, Meerbusch (DE)

( * ) Notice: Subject to any disclaimer, the term of this patent is extended or adjusted under 35 U.S.C. 154(b) by 617 days.

(21) Appl. No.: 10/598,325

(22) PCT Filed: Feb. 21, 2005

(86) PCT No.: PCT/EP2005/050748
§ 371 (c)(1),
(2), (4) Date: Mar. 10, 2008

(87) PCT Pub. No.: WO2005/081005
PCT Pub. Date: Sep. 1, 2005

(65) Prior Publication Data
US 2008/0252246 A1    Oct. 16, 2008

(51) Int. Cl.
*H02H 7/08* (2006.01)
(52) U.S. Cl. .............................. 318/490; 318/34; 318/51
(58) Field of Classification Search ............... 318/34, 318/51, 490
See application file for complete search history.

(56) References Cited

U.S. PATENT DOCUMENTS

| 4,777,446 | A | 10/1988 | Santandrea et al. |
| 5,998,958 | A * | 12/1999 | Lee ................................ 318/801 |
| 6,774,664 | B2 * | 8/2004 | Godbersen ..................... 324/772 |
| 6,862,538 | B2 * | 3/2005 | El-Ibiary ............................ 702/38 |
| 7,184,902 | B2 * | 2/2007 | El-Ibiary ............................ 702/60 |
| 2002/0158658 | A1 | 10/2002 | Godbersen |

FOREIGN PATENT DOCUMENTS
DE    197 09 596 A1    9/1998
WO    WO 2005/081005    9/2005

OTHER PUBLICATIONS

The Multi-phase Induction Motor Translation of N.N.: "Der Mehrphasen Inducktionsmotor" 'Online!, Oct. 25, 1997, pp. 1-1, retrieved from the Internet at URL:http://www.ebe-online.de/Home/tgobmaie/Tesla/polyphase.htm, retrieved on Aug. 24, 2006.

* cited by examiner

*Primary Examiner* — Bentsu Ro
*Assistant Examiner* — David S Luo
(74) *Attorney, Agent, or Firm* — Hunton & Williams, LLP (57) ABSTRACT

The recognition of a polyphase machine (1) connected to a converter (10) is suggested in order to adapt the converter (10) to the connected machine (1) prior to an active productive operation. The following is arranged for. Connecting of the polyphase machine with its several electric phases to the converter (10). Supplying of at least a first and a second test signal from the converter (10) to at least one of the several electric phases of the connected machine. Measuring of at least two causal sequences of the test signals. Evaluating of the measuring result to obtain measuring values (r1, r2) and allocating of these measuring values to a comparison function (60, 50). Comparing of the comparison function with a reference function (60a, 60b, 50a, 50b) which represents one type of a polyphase machine.

84 Claims, 7 Drawing Sheets

DETECTION METHOD FOR AN ELECTRICAL POLYPHASE MACHINE

CROSS-REFERENCE TO RELATED APPLICATIONS

The application is a U.S. National Stage Application of International Application of PCT/EP2005/050748 filed Feb. 21, 2005, which claims the benefit of German Patent Application No. 10 2004 008 885.3 filed Feb. 24, 2004, the disclosures of which are herein incorporated by reference in their entirety.

FIELD OF THE DISCLOSURE

The invention relates to a process for a recognition of a poly phase machine (motor or generator) connected to a converter. The machine comprises a stator and a rotor and "electric phases" as windings. A device working in this fashion is also disclosed.

BACKGROUND OF THE DISCLOSURE

Modern converters which activate electric polyphase aggregates (machines) such as synchronous machines or asynchronous machines can be switched over per se. They are not fixedly adapted to one machine type, but contain program segments and control functions for several machine types, e.g. the mentioned synchronous machines or asynchronous machines, or also other polyphase machines such as reluctance machines or synchronous-like machines or servo drives. Appropriately, a control and regulation of the different machine types is not implemented with the same control functions, regulation functions and also not with the same parameters. Any possible monitoring functions must also not be imperatively the same for the different machine types.

Upon the putting into operation, knowledge of the connected machine type is required, which is preadjusted to the convertor by the person putting the machine into operation before it is further adapted to the drive environment (in the case of motors) and the actual machine with the remaining parameters.

However, the knowledge of the machine type cannot always be attributed to the person carrying out the putting into operation. He must get a safe picture on the basis of control lists, type lists and other information as to which machine type must be currently put into operation. This is all the more difficult since servo motors cannot be simply differentiated from the outside as regards their type, i.e. whether they are of the synchronous machine type or the asynchronous machine type. From the outside it is hard to optically differentiate these servo drives; mostly, a type plate is helpful, which, however, does not always provide information in plain language on the type of the machine, but rather indicates other data on the environment of the drive such as voltage, power or pin assignment of the electrical phases.

SUMMARY OF THE DISCLOSURE

Consequently, the invention proceeds from the object of simplifying the putting into operation, to make it safer and to reduce the time required for this without the person carrying out the putting into operation having to be provided with lists or numerical columns in order to be able to recognize the motor types. In other words, the person is to be relieved of the problem of independently determining the machine type or to pre adjust it to the converter according to his own personal knowledge. In this respect the system should be able to adjust itself to the connected type of aggregate (=machine).

It is suggested that, the converter is provided with functions that enable it to recognize the type of the connected machine itself. This also applies to the control which contains program segments which make this selection possible. This object is likewise attained by a device which can implement the process steps covered inasmuch as they do not consist in that the line connections of the motor or generator and of the converter must be connected.

The functions enable an automatic recognition without the input of types. For instance, the recognition takes place by identifying a resistance or impedance function over the stator angle by means of a suitable stimulation. An at least single repetition is provided for at least one further test signal. At least one further measuring value results from this, which will be a component of a comparison function, which, according to the step (g), is compared with at least one of several reference functions.

The repetition relates to steps (b) to (d) and may also be a multiple repetition to form (supplement and expand) the comparison function. This period of time may also be called "recognition phase", possibly extended by the step of the comparison (step (g)), and, during this phase, the machine may already be rigidly coupled to the power take-off side via the shaft. If such a coupling is provided, the machine will not rotate during the recognition phase.

There are various shapes regards the type of the test signals during the repetition. The test signals may be the same, but then at different electric phases and/or at different electric angular positions of the stator field. In this connection, test signals in connection with angular positions must be avoided which supply redundant information. However, redundant measurements can also be combined so that they become a mean value which, repeatedly, results in a first measuring value at a specific angular position with one and the same test signal, this first measuring value as the first averaged measuring value being composed of several measuring values.

The identification of the impedance course over the angle takes place for the connected machine. If the impedance over the angle is approximately constant, it can be concluded that this is an asynchronous machine. If the impedance course has at least one unequivocal high point and bottom point (minimum and maximum), it can be concluded that this is a permanently excited synchronous machine.

The possibility of the recognition by the converter itself takes place within the framework of its control part, which, depending on the result of the recognition which is independently implemented by an identification without any influence by the person putting the machine into operation, enables the triggering routines for the converter or receives them adjusted.

Any type of power unit is to be understood by a converter, which is capable of emitting power actuating signals for activating the mentioned polyphase machine. In this connection it must be proceeded from the assumption that, here, various types of converters (dc-ac converters, controlled rectifiers, frequency converters, frequency transformers and other types) as being summarized here under the concept of a "converter". The converter is supplied from a mains which also may, but must not imperatively, have an AC voltage. A supply from a DC voltage circuit is also possible, it being possible that the latter is also provided as an intermediate circuit between two different a-c voltage circuits. This is not imperatively only a part of a single converter, but of a whole group of converters which use the same intermediate circuit.

After the connection of the electric phases of the polyphase motor or generator to the electric phases (outputs) of the converter, a supplying of a first test signal will take place prior to the beginning of a productive operation, i.e. upon the putting into operation. The test signal is transmitted via the connection lines between the converter and the polyphase machine and has at least one consequence. This causal consequence, e.g. a change in the current, the voltage or other physical magnitudes of the polyphase machine, is detected by means of an appertaining measuring device. The detected (first) measuring result is evaluated and, as a measuring value, allocated to a comparison function.

A plurality of successively recorded measuring results, result in a plurality of measuring points of the comparison function to be formed. The comparison function resulting from the evaluated measuring results is compared with a reference function.

Several reference functions may be available for the comparison in accordance with the number of the recognizable types of electrically operable polyphase machines. A converter may have as many reference functions as it is capable of operating type-oriented control programs or regulating programs or monitoring programs. Each of the reference functions stands for one type of polyphase machine so that the selection of the most similar reference function as compared with the comparison function ascertained by means of the measuring results establishes at the same time, which machine type is the most probable one.

It may already be sufficient to carry out the comparison with only one of the several reference functions, if the appropriate machine type can be ascertained with this first comparison. However, several comparisons can also be carried out and the similarity results of the comparisons can be compared with each other in order to ascertain the most similar reference function which then stands for the most probable machine type.

Proceeding from the type identification which was carried out in this fashion, one of several available system programs is selected and predefined for the productive operation. These programs may include such program segments or program parts such as a regulating part, a control part or a monitoring part. If an asynchronous motor was recognized, the regulating program part for the asynchronous motor is loaded, the appertaining control program part is loaded for the converter and the monitoring programs especially adapted to asynchronous machines are loaded. Instead of a direct selection from a local memory, these programs may also be made available via data connections, via which they are retrieved and predefined to the converter for its operation.

Due to these predefinitions the converter (with the control part) is adapted to the connected polyphase machine without the person carrying out the putting into operation had to implement a selection in this respect.

The comparative function ascertained from the test operation—prior to the active productive operation—is compared with at least one reference function. Such a comparison can be carried out in many ways, not imperatively by means of an optical comparison, which, however, is well suited for representation purposes. A comparison can e.g. be implemented by means of a correlation of the functions to be compared. A point-to-point comparison or other comparison functions of statistics may also be used. I.e. "comparison" stands symbolically for the ascertainment of the similarity of comparison and reference functions.

All currents and all voltages of the polyphase machine are involved in the measuring result which is preferably a resistance or an impedance and which, due to the several measurements and the several test signals, results in a resistance or impedance course. Consequently, it can also be talked about polyphase test signals. A polyphase test signal is applied to the electric phases, which jointly form[1] said test signal. The causal consequences originating from the test signals may be changes in the current or the voltage at a respective stator angle or changes in the number of revolutions or changes in the position. These changes are measured and then evaluated for the point-by-point formation of said comparison function.

The character of the test signal may be of a statistical nature, a pulse signal or an alternating signal may also be provided, which, as a stationary alternating signal or as a short-term alternate signal exercises influence, e.g. only as long as a specific physical rotational position of the rotor remains practically unchanged.

If the comparison function is formed from a plurality of measuring values, the plurality of angular positions, based on the non-rotating stator or the non-rotating stator field, is the common magnitude, over which the course of the physical magnitude influenced by the measurement is stored, plotted or represented. Here, such a representation or illustration is made symbolically in order to illustrate the mode of operation, but, in the course of the operation is not only illustrated in the manner represented descriptively here, but stored for recognition purposes. This course of the values is stored in a memory area both as regards the at least one reference function and as regards the comparison function and then compared with each other with the described comparison, applying positional correctness.

A continuous change in the position (rotational position) of the rotatable rotor of the polyphase machine should not take place, but may also take place so slowly that test signals with a higher frequency that are superimposed on this movement may still causally result in a representative measuring value at quasi stationary position points or rotational positions in the stator system. Here, possible movement frequency of the rotor and test signal frequencies are clearly different.

An advantage of the claimed invention resides in the ability of having or leaving the machine already coupled to the power take-off side mechanics (via the shaft) and to have the recognition phase executed. Here, if possible, no rotational movement of the shaft is generated. It is only allowed, when the recognition phase is completed and the motor type is recognized, in which situation the converter was adjusted to the rotational movement of the machine. This enables the type recognition of the machine even after a putting into operation and between productive operations, should the converter have been initialized or exchanged and have lost the previously programmed machine type as a storage.

The test signal used for the stimulation is described as being applied to the machine terminals. Prior to this, in its generation of the block diagram and/or circuit technology it also has other precursors as a test signal, which must not imperatively have the same appearance, in particular not in a field-oriented control or regulation. Here, a modulation of the d component in the field- or flux-oriented system (d-q transformation and orientation) can be stipulated, which, then, has an effect on all phases of the polyphase machine following the converter. Likewise, the physical measuring value resulting the causal consequence and measured at the machine such as the impedance may also result on different levels of the signal flow plan. A current vector can be ascertained in the field-oriented system and an impedance can be calculated on this symbolic level.

Inasmuch as it was talked about resistance or impedance as well as about test signals as an evaluation of the measuring results, they must not be imperatively understood only on one specific level of the signal flow plan. Only the physical measurement of the causal consequences takes place electrically near the polyphase machine, which, however, may be at quite a spatial distance, if the measurement is carried out in the converter and the cause of the current or voltage is transmitted to the polyphase machine through longer lines.

Mostly, it is proceeded from a three-phase system, in the case of three-phase current and in the case of electric phases of a machine, preferably of a drive as a synchronous motor or an asynchronous motor.

Since several poles may also be present in a machine, the explanation relates to an "electric machine" which may be multiply distributed on the circumference in the mechanical system in the case of a higher number of pole pairs.

In the most simple case of an assumed two-pole machine (p=2) the electric machine corresponds to the mechanical machine, which is represented as an example in the Figs. This must be correspondingly translated to a higher number of pole pairs.

The comparison function is allocated to the connected machine and is ascertained by means of the test signals; reference functions are allocated to types of machines so that a comparison can show of which type the connected machine is.

Here, it can be "electrically looked into" a respectively connected machine from the outside, however, as a rule, such an insight is optically only possible, if the machine is disassembled. Consequently, the normal case of the insight mostly ends at the terminal box for the connection of the electric phases of the converter to the electric phases of the machine. The electric looking into the machine implemented during a test operation (claim 1, step (b) to (d)), permits the checking of several angular positions of the test signal with respect to a rotor position (claim 1, step (e)). Here, the rotor may remain substantially non-rotated, if the various test signals in the stator system move in circumferential direction with respect to the rotor and represent an electric machine at discrete angular positions, but substantially completely in the comparison function; here, it may, however, also be provided that the rotor position is changed to its rotary angle and the electric signal remains non-rotated at the same angular position of the stator. Here, the actuating signal moves the rotor into different physical rotational positions and the electric test signal as a polyphase test signal remains at the same angular position in the stator system.

If there is a movement to a plurality of rotor positions, e.g. more than 50 rotational positions, the type of the connected machine can be inferred with a good degree of certainty. However, in the same fashion as the rotor can be rotated, the electric test signal may shift itself in circumferential direction, the rotor having substantially the same rotational position. It cannot be excluded that the rotor, influenced by electric test signals, also slightly moves across the electric phases, even in the case of small signal magnitudes and low frequencies. For this reason, it is advantageous to implement several changes in the direction of the alternating signals so that the one movement direction of the first test signal is contradirectionally compensated by the movement direction of e.g. the second or a further test signal. A repeated change is advantageous in order to make the rotation of the rotor that takes effectively place as small as possible.

In general words, the rotational position of the electric angles, represented by the flow vector of the test signals relative to the rotational position of the rotor, is either changed by the rotation of the rotor or by rotating the electric angles of the test signal. This relative change in position makes it possible to electrically look into the connected machine and to detect the effect on the measured quantity used for comparison purposes in various different position relationships.

Accordingly, the minimum number of measuring values must be applied to the minimum number of angular positions in the stator system in the case of a successively changed test signal. Due to the angular positions of the test signals the sampling screen is given, which is preferably less than 10° (electric machine), but may also be less than 3° in the case of higher resolutions. The corresponding number of the measuring values results in a comparison with an electric angle of 360°.

It is understood that the discrete measuring values are successively recorded in terms of time, i.e. they are also formed in a chronologically spaced relationship in the case of several polyphase test signals.

The smaller the time interval between the applying of successive test signals is, the quicker is the implementation of the comparison function which is allocated to the connected machine, before the comparison with the reference function, which recognizes its type, is implemented (claim 1, step (g)).

The meaning of the polyphase test signal resides in the several electric phases of the connected machine. However, it itself is also multiply used in the sense that several such test signals are successively applied to the connected machine, this plurality of test signals, the first, second, third etc. test signal, determining the number of the discrete points of the course of the comparison function to be ascertained.

A plurality of test signals results in a large number of points and thus a very well modelled comparison function for the connected machine. The coarser the resolution is, the more inaccurate is the course and the larger is the influence of freak values or measuring value errors as this is customarily the case with sampling systems.

BRIEF DESCRIPTION OF THE DRAWINGS

The invention is further explained by means of examples.

FIG. 5a,

FIG. 5b,

DETAILED DESCRIPTION OF EXEMPLARY EMBODIMENTS

Figure 4:
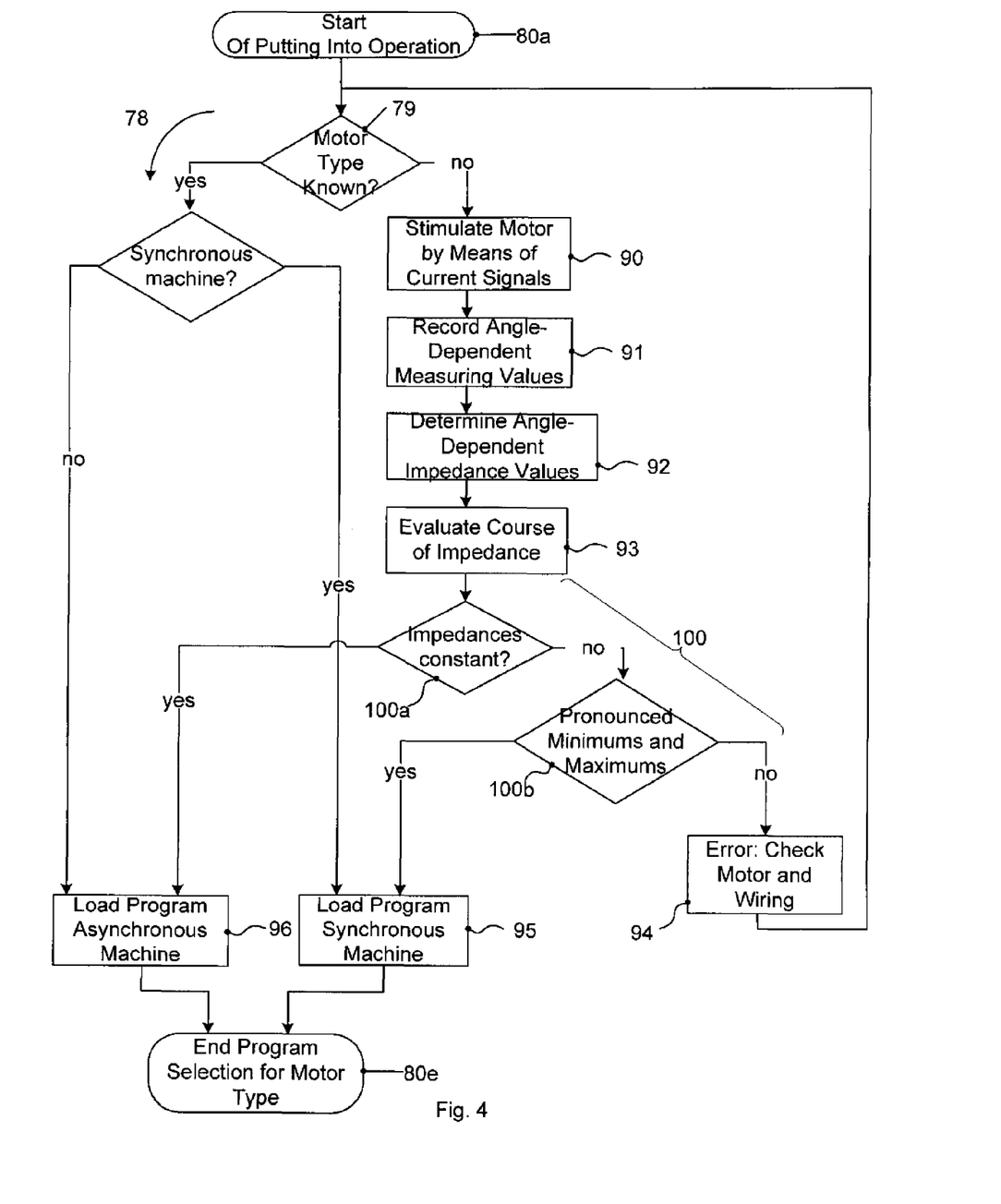
FIG. 4 illustrates a flow chart for a type recognition of the polyphase machine 1 of FIG. 1 or of FIG. 5 during a putting into operation (test operation). This is, e.g., prior to an active productive operation of a motor as a polyphase machine 1.

An exemplary process sequence for recognizing a polyphase machine connected to a convertor 10 is illustrated in FIG. 4 for a motor with a stator 1a and a rotor 1b. This sequence of a control program for such a recognition is shifted to the putting into operation for the example. The process begins with the putting into operation 80a and ends with the selection of the correct motor type at 80e, which is implemented by the control program. This program is part of a control program 20 according to FIG. 1, in which the environment is shown in which the recognition in the sense of an identification is carried out.

The normal operational sequence of the polyphase machine 1, also called MPA, is considered to be the productive operation. Prior to this, actions of the putting into operation take place.

Instead of a putting into operation the sequence control according to FIG. 4 can also be repeated at a later time, if the motor is exchanged, another motor 1 replaces it or if after a putting into operation no reliable results are achieved in a first productive operation. The term of the putting into operation is to be generally understood, it comprises both the first putting into operation and a later renewed putting into operation or a verifying of a putting into operation during an interruption of the productive operation.

The motor 1 which is shown here as an example is a possibility of a poly phase machine which also comprises generators. Asynchronous machines, synchronous machines, special designs of these machines such as servo motors, reluctance machines and other rotary field machines come into question as possible motors or generators. A respective type of a machine is to be recognized as this is illustrated in the flow chart of FIG. 3 and schematically in FIGS. 5a, 5b and 5c. At first, the person who implements the putting into operation connects the polyphase motor with its several existing electrical phases (as windings) to the converter. This is done by means of the terminal box 3 and a multi-wire line 4, which is connected to the converter terminals at the other side. Due to the higher switching frequency of the converter 10, this line may be shielded. The most customary number of phases is three. Thus, three lines (and one PE connection) are preferably connected within the framework of the line connections, are connected in a terminal box and the converter 10 is put into operation via a control 20 for the putting into operation.

The motor 1 with its output shaft is represented in a still not mechanically coupled fashion to the system to be driven. This can be done at a later point in time, if the motor has been recognized and the converter 10 has been adjusted to it. However, the drive may also be already coupled to the output-side mechanics (through the shaft or another coupling), in which condition, if possible, no rotary movement of the shaft (and the machine) should occur during the recognition.

Figure 1:
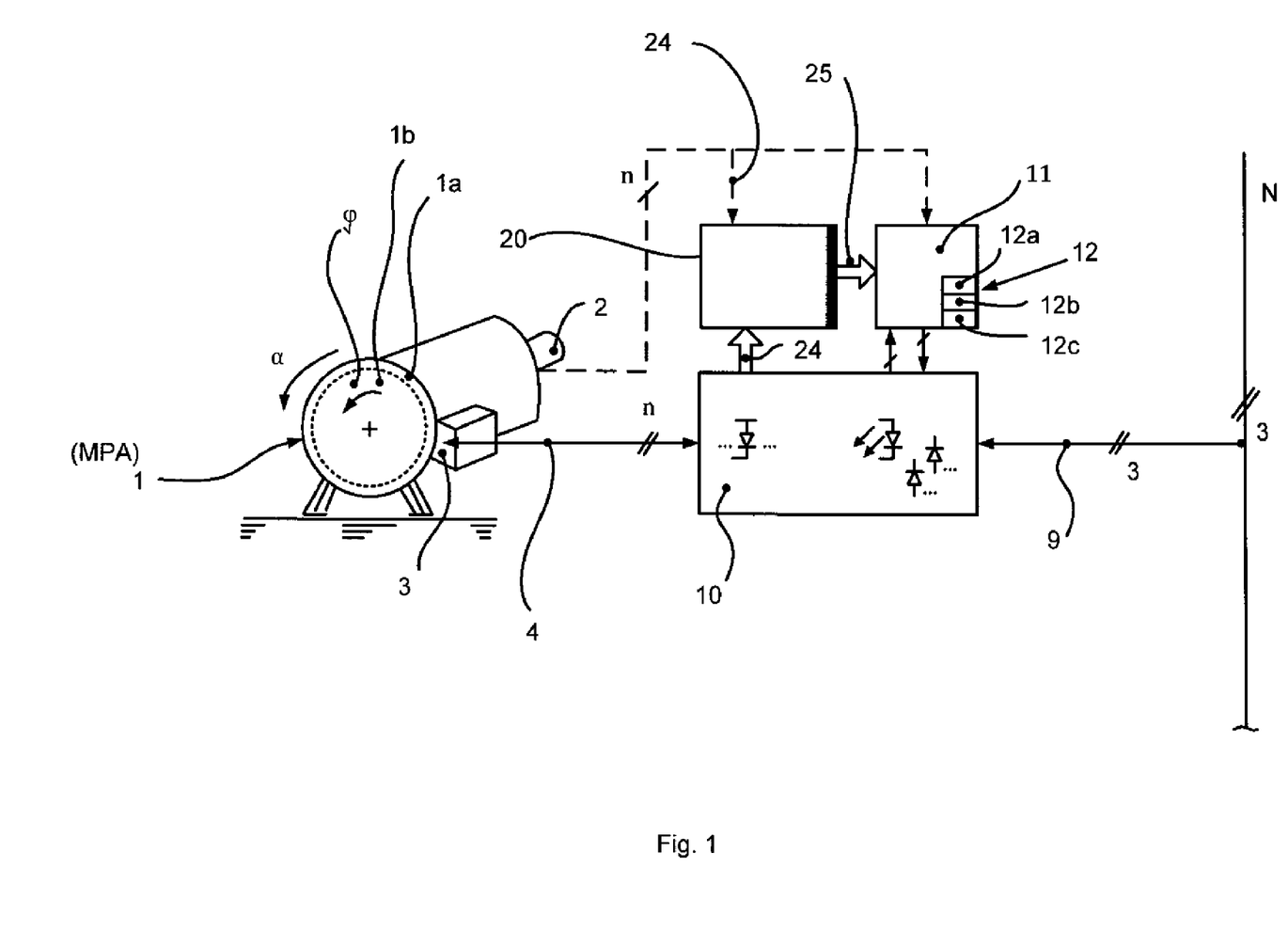
FIG. 1 illustrates a block diagram with symbolic represented elements of the regulator and control system for the putting into operation of a polyphase machine 1 via a converter 10, which is fed by a mains N.

The motor according to FIG. 1 has a symbolically outlined stator 1a and a symbolically outlined rotor 1b. The rotor has a rotor angle as the rotational position $\phi$ and a stator angle $\alpha$, which symbolizes the stator system.

At the input of the converter, it is feed by a poly phase mains, mostly a three-phase mains N, via feeding lines 9. This mains is symbolically represented by a rectifier transforming to an intermediate circuit. The intermediate circuit feeds a power output stage which is also symbolically represented with controllable power semiconductors. These are driven by LED activating means (e.g. as optocouplers) by a control 11, and this is also symbolically represented. This control contains all control programs, regulator programs and also monitoring programs that are necessary for the converter, which may relate e.g. to current measurement, current monitoring, monitoring of the number of revolutions and other measuring and monitoring functions. The control part 11 also receives measuring values from the motor 1 such as voltage and current values or a positional value course from transducers that are coupled with the shaft 2 and not separately plotted here.

A separate control circuit 20 is provided for the control and putting into operation, which influences the control part 11 of the converter by means of control signals 25 in order to thus also indirectly influence the signals at the output lines 4 and to receive their measuring signals and to be able to evaluate them within the framework of FIG. 4.

The actual recognition also takes place in the control circuit 20 which may also be integrated in the control part 11 as a program segment or a control program.

The power signals emitted by the converter are considered to be actuating signals via the connection lines 4. These actuating signals that are controlled and caused by the control circuit 20 are applied as test signals in a test operation. These test signals are generated in the course of the control and regulation in the control part 11 and are converted in the power part of the converter 10 so that they are also impressed or fed to the motor in the one or the other manner that will still be described.

The measurement of sequences of such test signals is carried out by the signal transmitters such as a current measurement, a voltage measurement, a measurement of the number of revolutions or a position measurement, which are not separately plotted and are signal transmitters customary in the sector of drive technology. Their signals as causal consequences are transmitted back to the control circuit 20, which is symbolically represented by means of a connection 24 transmitting several signals or can take place via lines 24'.

A stimulation of the motor 1 with said polyphase test signals does not require any additional line or additional sensing element, but uses the natural connection between convertor and motor.

The measuring values originating from the test signals are evaluated, said evaluation being explained below. The evaluation results in a comparison function, which is represented for two different motor types, an asynchronous machine and a synchronous machine with dots (synchronous machine) and with crosses (asynchronous machine) in FIG. 2. Here the comparison function is an impedance course $Z(\alpha)$ over the stator angle $\alpha$.

Several impedance curves or resistance curves can be plotted as comparison functions, the plotting being a storing in a memory area and not imperatively an optical presentation of this function course. However, it is sensible for representing and elucidating the working method of motor recognition to graphically plot these measuring values deposited in the memory area over the stator angle, and to possibly also display them on a display for the person carrying out the putting into operation. However, the visible representation is not necessary for the function of type recognition.

Figure 2:
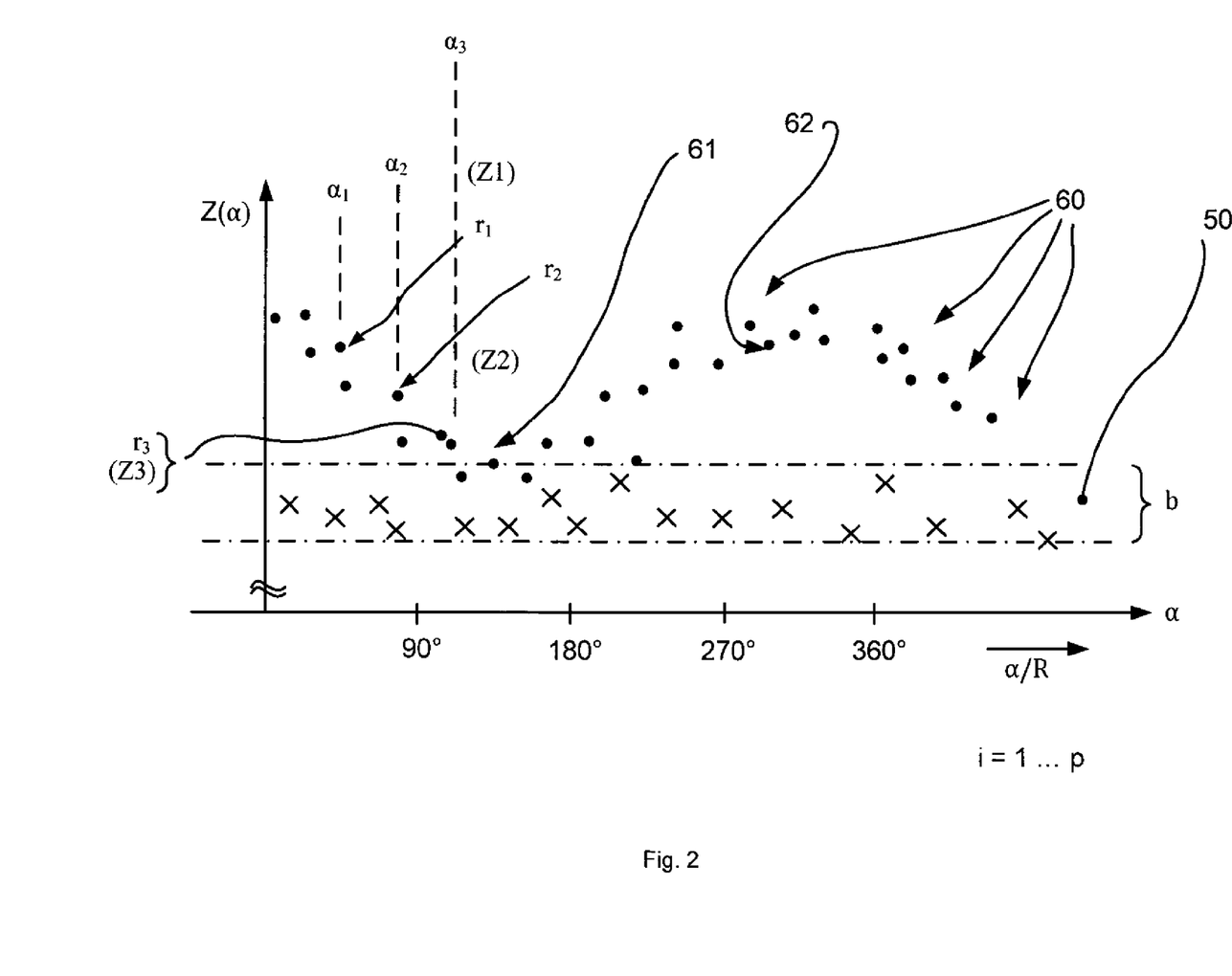
FIG. 2 illustrates a symbolic representation of identified (measured) comparison functions displayed over the stator angle $\alpha$ for two different machine types, the asynchronous machine DAM and the synchronous machine DSM.
Figure 3:
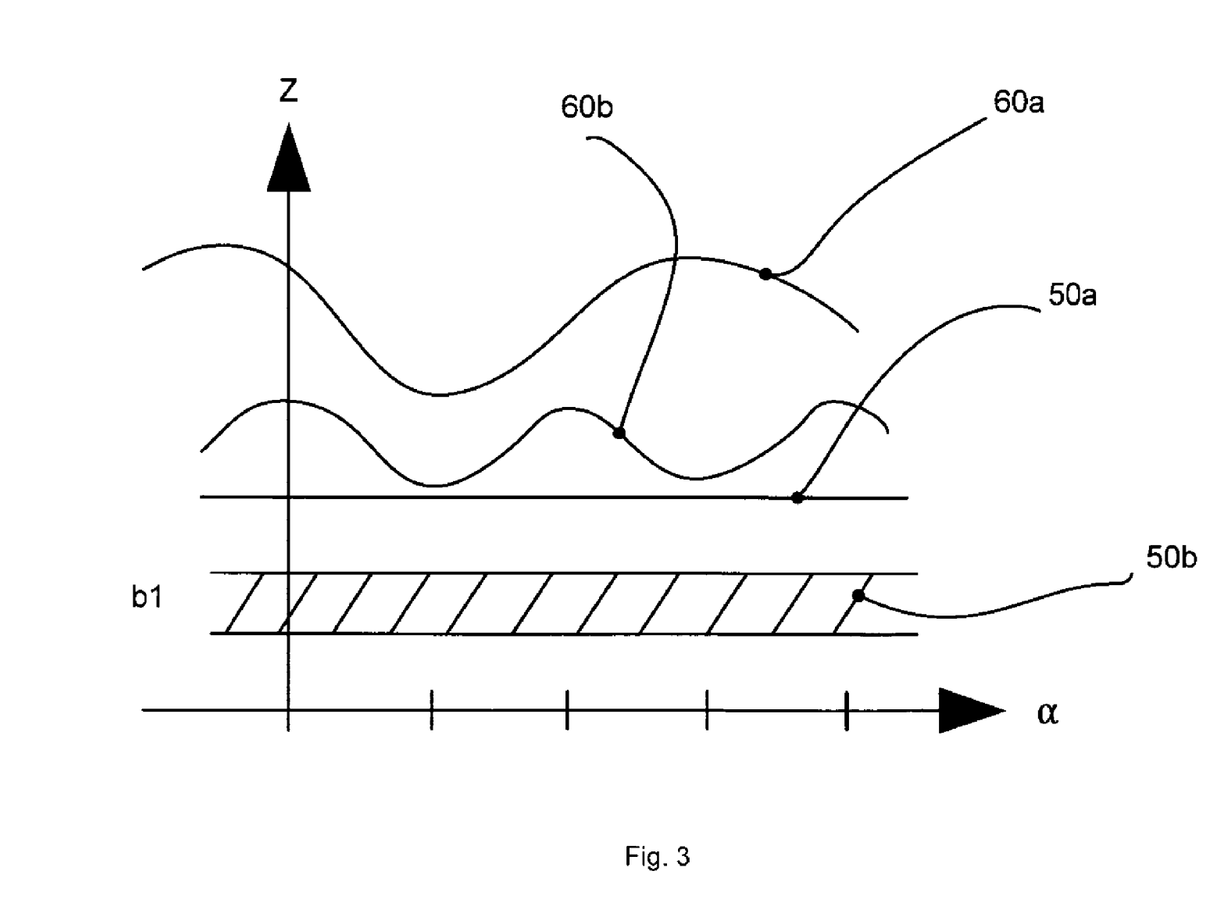
FIG. 3 illustrates reference functions for several types of polyphase machines, displayed over the stator angle $\alpha$.

At least one, preferably several reference functions are stored in the circuit control 20 or in a memory area of the control part 11 of the converter 10, some of which are illustrated in FIG. 3. They are reference functions, each of which being allocated to a specific machine type (motor type). Each of the reference functions represents one and only one machine type which is allocated to it. In the represented example two reference functions 50a, 50b are provided, which represent asynchronous machines. The reference functions 60a, 60b represent synchronous machines. The reference curve 60a represents a two-pole machine, whereas the reference function 60b represents a four-pole machine. An impedance course $Z(\alpha)$ according to FIG. 2, which characterizes an assumed motor is also plotted over the angle $\alpha$ of said motor.

As regards the reference functions it is not imperative to provide several functions for the same motor type so that the storage and the stipulation of the reference functions 50b and 60a would be sufficient for representing an asynchronous machine and a synchronous machine. However, it proved to be advantageous in the case of specific designs of synchronous machines or specific models of types of motors such as servo motors, if there are several reference functions which are coordinated to specific motor types and models with their course of resistance or impedance values so that a more reliable recognition of the motor is possible.

If a motor type has been recognized, the control environment in the control part 11 is coordinated with this type. This can be carried out by selecting or enabling one of several control programs 12a, 12b, 12c in a program memory 12, whereas the other control programs for the other motor types remain inactive or shut down. However, this can also be carried out by loading the control program used for the regulation is loaded for the recognized motor type in the random access memory from the main memory.

A regulator program and a monitoring program can be predefined in the same fashion instead of a control program.

Subsequently, the control part 11 is coordinated with the motor and can control the converter 10 in accordance with the stipulations of the use environment. The convertor is adapted to the connected machine 1.

The recognition is prepared without the program selection and without the comparison and there is a comparison function in accordance with FIG. 2, which can be used for determining the type of the connected motor. In cases that are difficult to recognize or if the automatic recognition results in unreliable results, such a comparison function can be displayed to the user on a display, which is not represented here, but was already previously mentioned, in order to enable him to draw the corresponding conclusions therefrom. The displayed result inherently provides the basis of being allocated to a specific motor type, which, however, possibly could not be recognized with a sufficient reliability by means of the reference functions existing in the sequence program of the control circuit 20 by means of an automated comparison.

According to FIG. 4 the start of the putting into operation starts after the motor 1 has been connected to the converter 10 by means of the connection lines 4 and the person carrying out the putting into operation informed the control circuit 20 at 79 by means of an input by means of an operator device that the motor type is not known. If the motor type is known, the recognition is simple and proceeds along the path 78. Then two inquiries are provided downstream as to whether it is a synchronous machine or an asynchronous machine, possibly also several other types of generators or motors in order to load the respectively appertaining program in the random access memory 12 of the control part 11.

The program of an asynchronous machine is loaded at 96 and, at 95, the program of a synchronous machine. Thus, the process of the putting into operation is completed and the motor type is recognized by means of a predefinition and/or an input by the user. If this input is not possible, the motor recognition proceeds at the NO branch (no) of the first inquiry 79.

In a first sequence step 90 the motor is stimulated (current is supplied to it) by means of current or voltage signals which—as mentioned above—are applied to the activating lines 4 by means of the converter 10. The angle-dependent measuring values are recorded in a second step 91. The angle dependence corresponds to the stator angle $\alpha$ and is designated with "i" in its discrete stipulations, i.e. $\alpha_1, \alpha_2, \alpha_3, \alpha_i$ at i=1 to p, which represent different stator angles and thus different angles of the stator field 1. i is a controlled variable between 1 and p, p being preferably between 50 and 360.

Impedances as examples of evaluations of the causal consequences at the motor 1 are determined in a third step. Current or voltage are e.g. provided as causal consequences in the case of a voltage and/or current stipulation. The measurement of these magnitudes results in the consequences of the applied test signals. The evaluation of these consequences can be carried out by means of the determination of a resistance or an impedance in the example represented here. This impedance is calculated as a measuring value in the evaluation for each angle $\alpha_i$ which has been adjusted.

The plurality of evaluated impedances is represented and evaluated as a impedance course $Z(\alpha)$ in a fourth step 93 in the sense of a comparison of this impedance function with preferably several given functions which are represented in FIG. 3. The determination of the comparison impedance course corresponds to FIG. 2.

The allocation of the specific impedance values in step 92 can either take place in each case after a determination of an impedance value so that the impedance curve or the impedance course in step 93 is gradually formed. However, the calculation of the impedances may also be postponed, in order to first of all collect measuring values for a plurality of rotational positions and to then jointly convert these measuring values to impedances and to prepare and store the impedance course.

This evaluation takes place in step 100. The impedance course is evaluated as to whether it is constant or substantially constant, which takes place in step 100a. This corresponds to an impedance course 50 according to FIG. 2. If this inquiry can be answered in the affirmative (YES), the control circuit 20 will load the program 12a to be used for asynchronous machines at 96 in the program memory 12 of the control part 11, will cause it to be loaded or enable this program segment in the program memory. The other program segments 12b, 12c will then be blocked.

If the inquiry 100a cannot be answered in the affirmative, a further inquiry 100b is carried out with respect to the distinct minimum or maximum of an impedance course 60, alternatively also with respect to several such minimums or maximums for polyphase machines. The extreme values are represented by the individually calculated measuring values r1, r2, . . . in the impedance course $Z(\alpha)$. If this inquiry 100b can be answered in the affirmative, the program 12c (or several program parts) for a synchronous machine are enabled at 95 or caused to be loaded or loaded, which takes place by taking in or storing a program segment 12c for the synchronous machine in the random access memory 12 of the control part 11. The programs 12a, 12b are blocked or not loaded.

The inquiry 100 may also be modified and consist of only one inquiry 100a, if it is ensured that only two motor types are offered for choice and the answer in the negative of the presence of the one motor type results automatically in the determination that the other motor type is connected.

However, the reliability of this relatively simple inquiry is improved, if each motor type that must be recognized, is separately queried and positively confirmed with a corresponding inquiry and a corresponding comparison of its characteristics (in accordance with a comparison of the comparison function allocated to it with at least one, preferably all other remaining reference functions). Thus, a conformity in the sense of the greatest possible similarity it is separately established for each motor type, if individual inquiries 100a, 100b are provided in order to select each motor type in a separate and positive fashion and to recognize, not by means of a negative selection, in which a motor type is established by the fact that n-1 motor types of the existing n motor types cannot be correct so that it has to be the n-th motor type.

If, for a connected motor type in the represented control sequence of FIG. 4 with two assumed motor types, none of the inquiries 100a, 100b can be answered in the affirmative; there is supposedly an error in the wiring or the system. Motor and cabling must be checked which is stipulated by step 94. Then, the recognition process starts again, either by means of the inquiry 79 of the motor type—as represented—or by the inquiry of an enabling which is given by the user and the stimulation of the motor at different angular positions according to step 90.

The inquiry 100a, 100b in the sense of a recognition 100, which is represented in a simplified manner in FIG. 4, can also comprise several groups of inquiries and several inquiries, as was explained at the beginning by means of the several reference functions of FIG. 3.

The "inquiries" that are represented in a symbolic and simplified fashion could also comprise calculations, which comprise the ascertained reference function 50 or 60 with at least one, preferably all reference functions 60a, 60b, 50a, 50b that are contained in the control circuit 20. The comparison can be carried out by means of known calculation methods, in particular those of statistics. An example of a possibility of checking two functions with respect to their similarity is the correlation. Then it replaces the inquiries 100 of the sequence diagrams of FIG. 4.

The test signals which may be used are manifold. Statistic signals may be impressed, alternating signals may be impressed, it can be worked with pulse signals and a short alternating signal may be predefined, which is only fed to the motor for the duration of the maintaining of a measuring angle $\alpha_I$ via the connection lines 4. All test signals are polyphase, in most cases 3-phase test signals will be concerned, which jointly act on the motor via its connection lines 4.

Various types of the test signal obtaining are, on the one hand, a modulation on the d-q side of a field orientation. However, a corresponding stimulation of the motor 1 can also take place at other points of the signal circuit diagram, the several, in particular three, voltage values which are impressed on the three phases establishing the angular position or position $\alpha$, to which an appertaining test response belongs (as a causal consequence).

It must not be a slowly rotating stator field which samples the motor 1 at the circumference as a vector of a field orientation. It may also be individual sampling points which must not directly follow each other. They only have to be correctly allocated again in the determination of the course, e.g. of the impedance.

Signal pulses are possible at the output side of the converter 10 as voltage pulses as is a voltage system modulated to three phases which itself slowly rotates with the vector of a field orientation.

The flow chart with d/q orientation is an example of a calculation in which the impedance values $Z(\alpha)$ as a function of $\alpha$ (stator angle) are used. Current values can likewise be used, if they are a (causal) consequence of the input signal which is used as a test signal (stimulation signal).

The comparison explained in FIGS. 2 and 3, which takes place in the sequence diagram in the area 100, will be explained in greater detail.

The operand "impedance" used in the example is determined for a plurality of positions which read $\alpha_1, \alpha_2, \alpha_3, \ldots \alpha_I$ as discrete magnitudes, namely by evaluating measuring values in the sense of a calculation of an impedance value based on current measurement and voltage measurement.

Other operands can also be used. Instead of a calculation, a current signal can also be directly used for recording and for allocating to the comparison function.

However, that what is compared, must be comparable so that the abscissa, here the stator angle, must be comparable with the reference functions according to FIG. 3 and the ordinate, here the impedance value, must also be comparable. If current values, voltage values or position values or rotational speed values are plotted in order to implement comparisons, the reference functions according to FIG. 3 have the corresponding shape and/or functions.

The polyphase stimulation via the control lines 4 by means of a test signal which is not separately represented here, but was explained above, is discretely carried out at several $\alpha$ values, i.e. several stator angles of the motor 1.

However, a slow change in the angle in a range of 1 Hz of the rotational speed can take place so that at the respective point in time short-term test signals are applied, which are then allocated to a fixed discrete angular position. Here, the test signals have a clearly higher frequency than the frequency of the rotary field $\omega_d$, which moves the rotor of the polyphase machine which has not been recognized as yet.

For such a movement and such an activation in the sense of a mere control and a stipulation of a signal the regulation is not to be coordinated with the motor type as yet, it can rather also take place irrespective of the fact whether the motor type is already known.

The short-term frequency signal which is impressed on the control signals or only stipulated at the fixed angular position as an example of a test signal has preferably a frequency of several 10 Hz in order not to change the polyphase machine 1 at its rotational position stipulated for the measurement. The frequency of the alternating signal as the test signal may also be selected higher, more than 100 Hz. If they are statistic or pulse signals, the used frequencies are anyhow far above the mentioned lowermost frequency of 10 Hz.

As a result measuring values must be recorded which are considered to be the "causal consequence" of the test signal (test response). Either measuring values such as the impedance Z or other operands are determined from these measuring signals, which are available for a comparison by means of a reference function and a comparison function.

The number of the measuring values r1, r2, ... which was recorded and evaluated in this fashion and allocated to a comparison function should not be selected too small. Tests have shown that 50 measuring values along the course of an electric rotary angle already furnish reliable results. A higher accuracy is achieved if more test values, up to 360 values, are picked up with an angular increment of 1°. Possibly, angular differences (increments) of 10° up to less than 3° are sufficient (120 measuring values).

As a matter of course, a not non-steady function as a graph of the comparison function 50 results, which has a certain band width of the measuring values around an ideal constant function. This is illustrated in FIG. 2 for a synchronous machine with the measuring values and/or calculating values in the course 60 as it is shown for an asynchronous machine in a band width area b in the course 50.

It can never be avoided that there are also freak values from an approximated course, which can be sorted out in advance in a pre-filtering or plausibility control as deviating too strongly from a mean value, in order not to falsify the real measuring result. Then, the measuring or calculating values for a physical magnitude which are in one band width remain, in this case of the impedance Z which permits a comparison with reference functions according to FIG. 2. The function 60 for a DSM (synchronous machine) has a distinct minimum 61 and a distinct maximum 62, whereas the function 50 as another ascertained comparison function of a connected asynchronous machine does not have any such distinct maximum or minimum. All measuring or calculating values are found within the framework of a tolerance band which may be selected in the range of ±20% or less then ±10% or less. The reference magnitude is the mean value from all measurements (all test signals).

This tolerance band can either be used in the recognition of the function of FIG. 2 or it can be taken as a basis of the comparison in the case of a reference magnitude according to function 50b with a tolerance band b1 without already evaluating or analyzing the individual calculating or measuring values of the function course 50 in FIG. 2. If a plurality of the found calculating or measuring values are within the comparison band b1, it can be concluded to an asynchronous machine within the framework of the decision making 100 according to FIG. 4.

The formation of a mean value offers itself for establishing the tolerance band. The formation of a mean value of all measured magnitudes is the stipulation for the percentage indication of the tolerance band to be permitted, if, then, it is to be analyzed whether all measured values are "substantially constant", i.e. are within a given tolerance band or do not have any distinct maximum or minimum.

Several reference functions, e.g. 50a, 50b allow the conclusion to the same type, on the one hand, for a more accurate recognition of a constancy of the measuring values at 50a and, on the other hand, for a larger tolerance width b1 at the reference function 50b.

Reference functions for synchronous machines may have different numbers of minimums and maximums depending on the number of poles. Here, a standardization can also be carried out which ensures that only one minimum and one maximum are regularly compared in accordance with the reference function 60a.

If an identification according to FIG. 2 results in several minimums and maximums, the function 60a is accordingly compressed so that it can serve as a comparison standard. The individual discrete measuring values at $\alpha_1$, $\alpha_2$, $\alpha_3$ form the comparison function according to FIG. 2, the index i being from 1 to p. Resistance values $r_i$ can also be assumed instead of impedance values $z_i$.

The measuring values in the stator system α are plotted for the example, in which the rotor angle φ remains practically unchanged. If the individual test signals are applied in a chronologically spaced relationship in such a way that they have different directions of movement and are also of a small amplitude as alternating signals, hardly any movement of the rotor 1b results. Here, it has a beneficial effect, if the alternating signals successively adopt different directions of movement, which is implemented by means of changing the poles of the phases in the control system. A frequent change ensures that the movements of the rotor accumulate effectively to practically zero (during the duration of the test).

If, in an alternative case, the rotor is changed by means of its positional angle of the rotor φ, the angle α of the test signal remains substantially the same. Both possibilities permit a relative rotation of the rotor position and the angular position of the test signal.

Figure 5A:
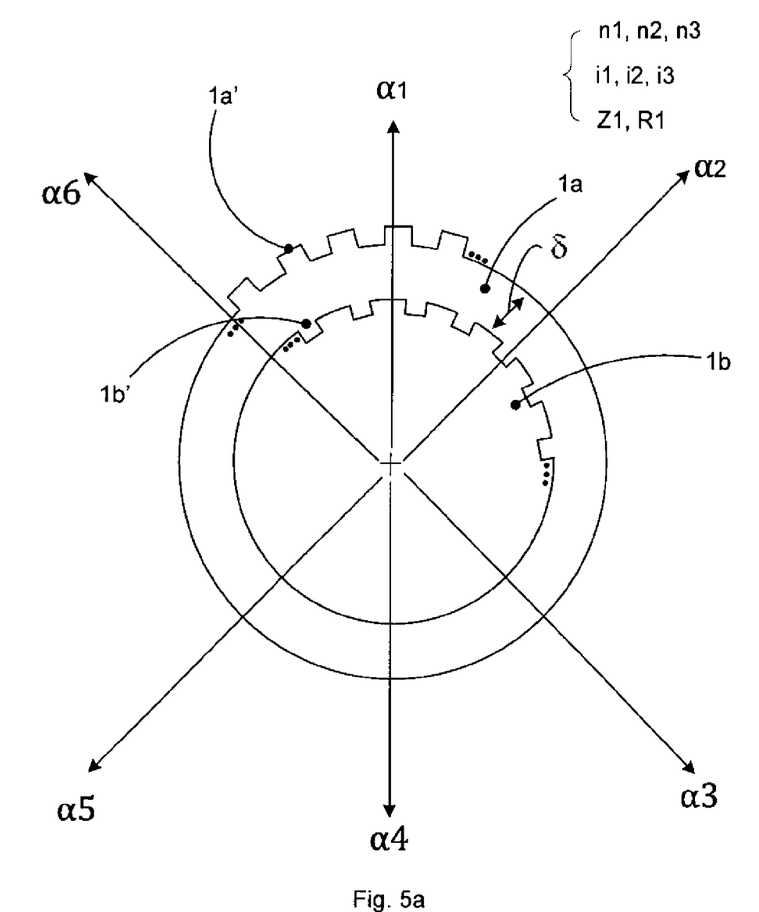
Figure 5B:
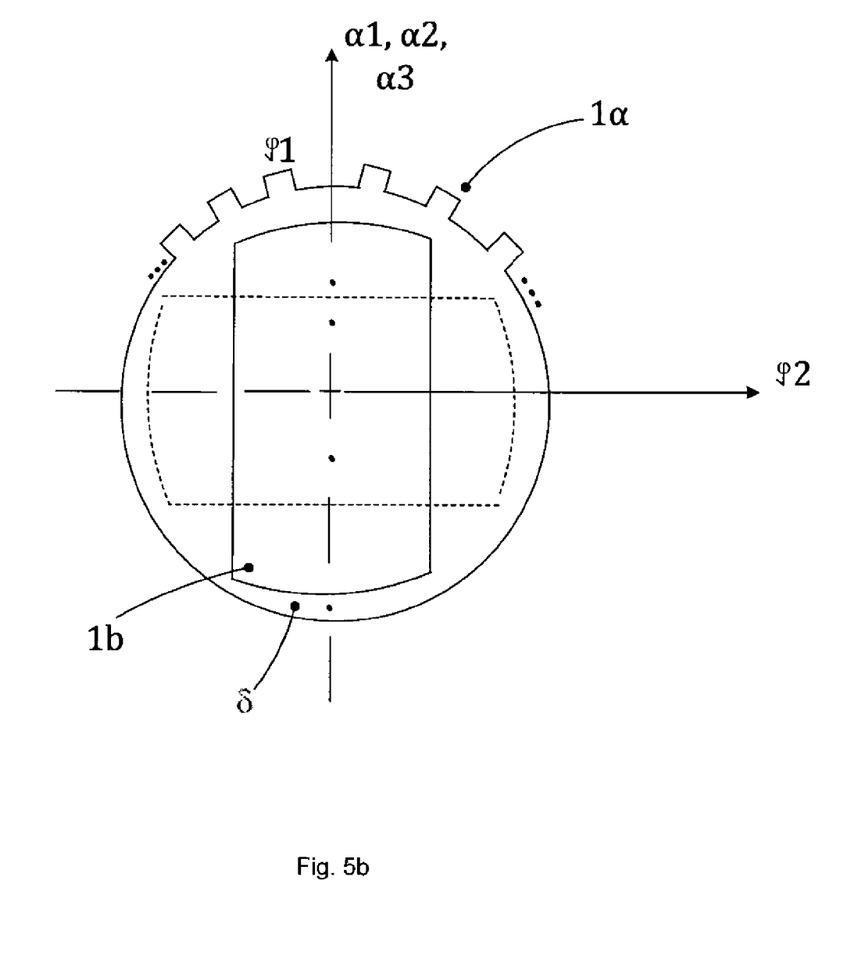
Figure 5C:
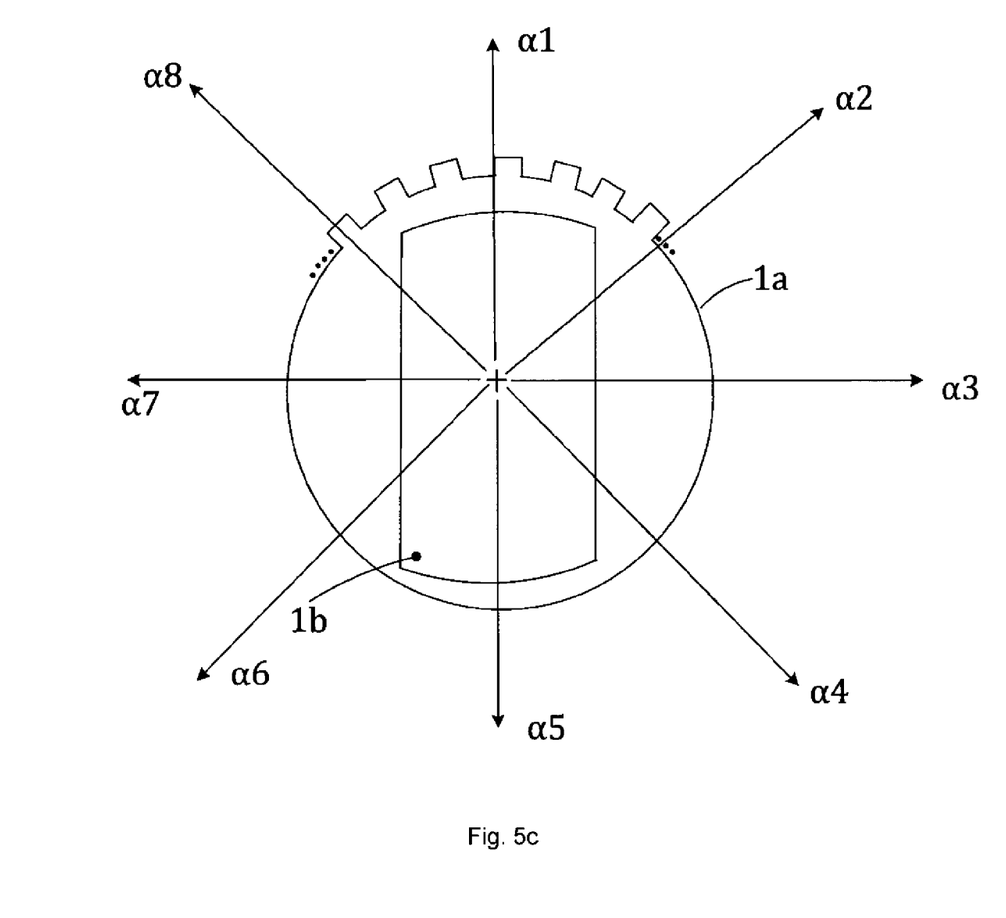
FIG. 5c illustrate various sections, vertically to a shaft or drive axle of a machine, to illustrate various machine types and the angular positions in the stator which are used by the type recognition and designated with $\alpha_i$ (or $\alpha i$).

FIGS. 5a to 5c show sections of various motors with rotor 1b and stator 1a.

A slotting 1a' of the stator and a slotting 1b' of the rotor are symbolically provided in FIG. 5a, in which the windings of stator and/or rotor are placed. The air gap δ (delta) can be seen in the sections. Due to the respective winding, a respective linear current density is generated during a "supplying of current" to the stator and/or rotor winding with the result of a magnetic field in the air gap which is positioned by the polyphase test signal, and, thus, also an angular position of the flow vector of the test signal is given, which is given with six discrete angular positions α1 to α6 in the asynchronous machine according to FIG. 5a.

If in the machine according to FIG. 5a α1, then α2, α6, then α3, α5 and finally α4 are successively measured, then there is hardly any effective rotation of the rotor 1b with respect to the stator 1a, seen as a whole. A comparison function for the machine of FIG. 5a, which is ascertained in this fashion with six test signals at stator positions α1 to α6, would correspond to the function 50 of FIG. 2 as an asynchronous machine. The rotor does not have any substantial variations of the air gap at its circumference.

A synchronous machine is represented in FIG. 5b which is changed by means of control signals with its rotor angle φ of the rotor 1b and in which the stator angle α1, α2, . . . αn always remains at the same angular position of the stator.

The zero angle φ1 of the rotor and the stator is left during the measurement, but the relative position between rotor and stator permits the measuring of a function 60 as a comparison function according to FIG. 2 and its storing in the memory of the control part 11. The rotational position φ2 of the rotor is symbolically drawn in dash-dotted fashion, which corresponds to an angular position α in the stator of α=90°, if the rotor would have remained at φ1.

Finally, FIG. 5c illustrates the measurement of a synchronous machine in accordance with the stipulation of a practically constant mechanical rotational position φ of the rotor 1b and of a discretely changing stator angle $\alpha_i$ for the several test signal, eight thereof being used in the represented example, from l=1 to l=8. A comparison function 60 according to FIG. 8 with eight discrete points (measuring values) follows from this, which have in their course a distinct minimum and a distinct maximum.

What is claimed is:

1. A process for a recognition of a polyphase machine connected to a converter comprising a stator and a rotor, the process comprising:
   (a) connecting the polyphase machine with several electric phases to the converter;
   (b) supplying of a first test signal from the converter to at least one of the several electric phases of the connected polyphase machine;
   c) measuring of at least one causal consequence of the first test signal as a measured result;
   (d) evaluating the measured result as a causal consequence in order to obtain a first measuring value (r1);
   (e) repeating of at least once steps (b) to (d) for at least one further test signal and obtaining at least one further causal consequence and at least one further measuring value (r2);
   (f) allocating of these at least two measuring values to a comparison function;
   (g) comparing the comparison function with at least one of several reference functions, each of which representing one type of a polyphase machine to select the reference function which is most similar to the reference function;
   (h) providing one of several available system programs in a control section of the converter in accordance with the selected reference function;
   to adapt the converter to the machine supplied by the converter.

2. The process according to claim 1, wherein the comparison function for at least one or more windings of the electric phases of the polyphase machine is created with several measuring results of several test signals, said several measuring results step by step are forming the comparison function by one of expanding and supplementing.

3. The process according to claim 2, wherein the comparison function is compared with several reference functions to determine a most similar thereof and the corresponding machine type.

4. The process according to claim 3, wherein at least two reference functions do not represent the same machine type of polyphase machine.

5. The process according to claim 1, wherein one of the reference functions represents an asynchronous machine as a polyphase machine.

6. The process according to claim 1, wherein one of the reference functions (60a) represents a synchronous machine as a polyphase machine.

7. The process according to claim 1, wherein the repetition according to step (e) is implemented at least one other electric phase of the machine other than the phase used for steps (b) to (d) for obtaining the first measuring value (r1).

8. The process according to claim 1, wherein the converter comprises a control section and a power section.

9. The process according to claim 1, wherein the converter is a power device which provides power actuating signals via several electric output phases and obtains power supply from an intermediate circuit fed from a rectifier from a mains.

10. The process according to claim 1, wherein the comparison function and the at least one reference function represent the same physical magnitude as a sequence of measuring values (r1, r2) over the same system magnitude.

11. A process according to claim 10, wherein the physical magnitude is a resistance or impedance (Z) over a stator angle ($\alpha$) or stator field angle of the connected polyphase machine.

12. The process according to claim 11, wherein at least the majority of the resistance and impedance values (r1, r2, ...) are provided dependent from the stator angle ($\alpha$) and are within a band (b) formed by no more than substantially ±20% of a mean value which results from the measuring values.

13. The process of claim 12, wherein the band is formed by less than ±10% of the mean value.

14. The process according to claim 11, wherein the measuring magnitude from the measured causal consequence of the first test signal is another physical magnitude than an impedance or resistance.

15. The process according to claim 10, wherein a course of the physical magnitude as a measuring value sequence in the reference function is substantially constant over a stator angle ($\alpha$).

16. The process according to claim 10, wherein at least one reference function does not have a distinct maximum and has no distinct minimum.

17. The process according to claim 10, wherein a course of the physical magnitude of at least one reference function has at least one distinct minimum and at least one distinct maximum.

18. The process according to claim 1, wherein several measuring results are evaluated and are allocated to the comparison function as several measuring values (50, 60), the evaluation including a conversion to determine a measuring value from the measuring result.

19. The process of claim 18, wherein the conversion comprises a resistance or an impedance calculation using a current measurement.

20. The process according to claim 1, wherein the several system programs represent several types of polyphase machines.

21. The process of claim 20, wherein the system programs are at least one of a regulator program part, a control program part, and a monitoring program part.

22. The process according to claim 1, wherein the at least one causal consequence is at least one of current, voltage, rotary speed or change in position.

23. The process according to claim 1, wherein the first test signal is one of a stationary alternating signal, a pulse signal and a short-term alternating signal.

24. The process according to claim 23, wherein the alternating signal has a frequency of at least 10 Hz or a multiple thereof to not substantially change a rotor of the polyphase machine in rotational position ($\phi$) thereof, while the alternating signal is present at the electric phases or windings of the polyphase machine.

25. The process according to claim 23, wherein the first test signal has a frequency of more than substantially 100 Hz.

26. The process according to claim 1, wherein a respective test signal is impressed on the several phases at the same time and is a respective polyphase test signal.

27. The process according to claim 1, wherein an alternating basic signal of less than substantially 10 Hz as the polyphase actuating signal slowly rotates the rotor of the polyphase machine in a rotational position ($\phi$) thereof and several test signals are modulated onto the polyphase actuating signal at a time distance.

28. The process according to claim 1, wherein the rotor (1b) of the polyphase machine is moved to several, not equal (different) rotor positions ($\phi1$, $\phi2$) with an actuating signal in order to apply a respective test signal to the electric phases while the rotor remains at a respective rotational position and to measure the respective causal consequence for the evaluation to several measuring values for the comparison function.

29. The process according to claim 28, wherein the movement providing for a plurality of rotor positions ($\phi$) of the polyphase machine and are measured as regards a respectively causal consequence of a respective test signal.

30. The process of claim 29, wherein more than 50 rotational positions are provided for a plurality of rotor positions.

31. The process according to claim 1, wherein steps (b) to (d) a repeated for a further test signal to obtain a further measuring value (r2).

32. The process according to claim 31, wherein the repetition is carried out several times until a comparison function provided with several measuring values is formed for being compared with the at least one reference function according to step (e).

33. The process according to claim 31, wherein each further polyphase test signal as a second, third, etc. test signal is a polyphase signal for forming several flux position vectors in the stator system ($\alpha$) of the machine, said vectors being located at different angular positions ($\alpha1$, $\alpha2$, $\alpha3$) of the stator, at no substantial movement of the rotor.

34. The process according to claim 1, wherein the first test signal and all further test signals are provided in a three-phase system of a three-phase mains.

35. A device that is operable in accordance with the process recited in claim 1.

36. The process according to claim 1, wherein during at least steps (b) to (f) the machine is already coupled at a power take-off side via a shaft.

37. The process according to claim 1, wherein the machine (1) does not substantially rotate during a recognition phase with at least non-recurring or repeated steps (b) to (f).

38. The process according to claim 1, wherein the supplying of further test signals takes place at a respectively different electric angular position ($\alpha$) of the stator field.

39. The process according to claim 38, wherein the test signals are equal.

40. The process of claim 1, wherein the process for a recognition of a polyphase machine occurs prior to an active productive operation of the machine.

41. The process of claim 1, wherein the first test signal is supplied to at least one of the several electric phases.

42. The process of claim 1, wherein the two reference functions are representing different types of machine.

43. A process for preparing a recognition of a type of a connected polyphase machine as a machine with a rotor and a stator, said machine being activatable by a converter by actuating signals to several electric phases; wherein
    the machine is connected to the converter and is supplied with a plurality of polyphase test signals via a polyphase electric winding of the machine at a plurality of stator angles ($\alpha 1$, $\alpha 2$, $\alpha 3$), with substantially no movement of the rotor;
    measuring causal consequences of a respective polyphase test signal at a respective angular stator position;
    determining a measuring value (r1, r2; $z_i$) from the measured causal consequences of the respective polyphase test signal at the respective angular stator position of the stator of the connected polyphase machine;
    determining a plurality of measuring values and establishing a comparison function, whereby said measuring values are resistance or impedance values ($z_i$) are provided over the plurality of angular stator positions ($\alpha_i$) establishing the comparison function as a function over an electric rotary field angle ($\alpha$);
    to prepare an allocation of a machine type to the connected machine.

44. The process according to claim 43, wherein the causal consequence of a respective test signal at a respective stator angle ($\alpha$; $\alpha 1$, $\alpha 2$) are current values and a measuring value determined therefrom is a respective resistance or impedance value ($r_i$, $z_i$) at a respective angular stator position ($\alpha_1$).

45. The process according to claim 43, wherein each test signal is a three-phase signal which forms a flux vector in the angular stator system ($\alpha$) and for a plurality of dissimilar angles ($\alpha 1$, $\alpha 2$, $\alpha 3$), test signals are given for the establishing a measuring value function as the comparison function of the connected machine suitable to be stored over the stator angle ($\alpha$) or to be plotted.

46. The process according to claim 45, wherein the test signals are not rotating the rotor or only rotate the rotor minimally until a complete comparison function is completed.

47. The process according to claim 43, wherein the electric angles ($\alpha 1$, $\alpha 2$) of several test signals and the mechanical angular position ($\phi$) of the rotor relative to each other are changed in order to detect different positions of the rotor with respect to the angles of the test signals from the stator.

48. The process according to claim 47, wherein the angular differences between adjacent angles of two test signals are less than 10°.

49. The process of claim 48, wherein the angular differences between adjacent angles of two test signals are less than 3°.

50. The process according to claim 47, wherein one direction of movement of a test signal during the establishing of the comparison function changes repeatedly in order to minimize an effective rotation of the rotor.

51. The process according to claim 43, wherein the angles as angular positions relate to a pair of poles.

52. A device that is operable in accordance with the process steps of claim 43.

53. A process for the recognition of a polyphase machine connected to a converter, the machine comprises a stator and a rotor, the process comprising:
    (a) connecting the polyphase machine with its several electric phases to the converter;
    (b) supplying of a first test signal from the converter (10) to at least one or a few of the several electric phases of the connected polyphase machine (1);
    (c) measuring at least one causal consequence of the first test signal as measured result;
    (d) evaluating the measured result of the causal consequence in order to obtain a first measuring value (r1, r2) and allocating the measuring value to a comparison function;
    (e) comparing the comparison function with at least one of several reference functions, each of which representing one type of a polyphase machine, whereby two reference functions do not represent the same type of machines, to select a reference function which is most similar to the comparison function;
    (h) providing one of several available system programs in a control of the converter by means of the selected reference function;
    to adapt the converter to the machine.

54. The process according to claim 53, wherein the comparison function for all windings of all electric phases of the polyphase machine is created with several measuring results of several test signals, and each measuring results enhances the comparison function.

55. The process according to claim 54, wherein the comparison function is compared with several reference functions in order to determine a most similar thereof and the machine type represented thereby.

56. The process according to claim 55, wherein at least two reference functions do not represent the same type of polyphase machine.

57. The process according to claim 53, wherein one of the reference functions represents an asynchronous machine as a polyphase machine.

58. The process according to claim 53, wherein one of the reference functions represents a synchronous machine as a polyphase machine.

59. The process according to claim 58, wherein one of the reference functions represents a synchronous generator as a synchronous machine.

60. The process according to claim 53, wherein the converter comprises a control section and a power section.

61. The process according to claim 53, wherein the converter is a power device which provides power actuating signals at several electric output phases and obtains actuating power from an intermediate circuit, which is fed from a rectifier from a mains.

62. The process according to claim 53, wherein the comparison function and the at least one reference function represents the same physical magnitude as a sequence of measuring values (r1, r2) over the same system magnitude.

63. The process according to claim 62, wherein the physical magnitude is a resistance or impedance (Z) over a stator angle ($\alpha$) of the connected polyphase machine.

64. The process according to claim 62, wherein a course of the physical magnitude as a measuring value sequence in the reference function is substantially constant over a stator angle ($\alpha$).

65. The process according to claim 62, wherein at least one reference function does not have any distinct maximum and any distinct minimum.

66. The process according to claim 62, wherein a course of the physical magnitude of at least one reference function has at least one distinct minimum and at least one distinct maximum.

67. The process according to claim 53, wherein at least the majority of the measured resistance and impedance values (r1, r2, . . . ) allocated over the stator angle (α), are within a band (b) which is formed by not more than substantially ±20% of a mean value which results from the measuring values.

68. The process of claim 67, the band is formed by not more than ±10% of the mean value.

69. The process according to claim 53, wherein the measuring magnitude from the measured causal consequence of the first test signal is another physical magnitude than an impedance or a resistance.

70. The process according to claim 53, wherein several measuring results are evaluated and are allocated to the comparison function as several measuring values, the evaluation including a conversion to determine a measuring value from the measuring result.

71. The process according to claim 53, wherein the several system programs are provided for several types of polyphase machines.

72. The process of claim 71, wherein the system programs are at lest one of a regulator program part, a control program part, and a monitoring program part.

73. The process according to claim 53, wherein the at least one causal consequence are current, voltage, rotary speed or change in position.

74. The process according to claim 53, wherein the at least first test signal is a stationary alternating signal, a pulse signal or a short-term frequency alternating signal.

75. The process according to claim 74, wherein the alternating signal has a frequency of at least 10 Hz in order not to substantially move a rotor of the polyphase machine in a rotational position (φ) thereof, while the alternating signal is present at the electric phases of the polyphase machine.

76. The process according to claim 74, wherein the first test signal has a frequency of more than substantially 100 Hz.

77. The process according to claims 53, wherein a respective test signal is impressed on the several phases at the same time and being polyphase test signals.

78. The process according to claims 53, wherein an alternating basic signal of less than substantially 10 Hz as the polyphase actuating signal initiates the rotor of the polyphase machine to slowly change a rotational position (φ) and several test signals are modulated onto the polyphase regulation variable at a time interval.

79. The process according to claim 53, wherein the rotor of the polyphase machine is moved to several different rotor positions (φ1, φ2) with an actuating signal in order to apply a respective test signal to the electric phases remaining at a respective rotational position and to measure a respective causal consequence.

80. The process according to claim 79, wherein movement to a plurality of rotor positions (φ) of the polyphase machine, takes place and are measured as regards a respectively causal consequence for a respective test signal.

81. The process according to claim 53, wherein steps (b) to (d) a repeated for a further test signal to obtain a further measuring value (r2).

82. The process according to claim 81, wherein the repetition is carried out repeatedly until a comparison function provided with several measuring values is formed, for comparison with the at least one reference function according to step (e).

83. The process according to claim 81, wherein each further polyphase test signal as a second, third, etc. test signal is a polyphase test signal for forming several flux position vectors in the stator system (α) of the machine, said vectors being located at different angular positions (α1, α2, α3) of the stator with no substantial movement of the rotor.

84. A process for preparing a recognition of a type of a connected polyphase machine as a machine with a rotor and a stator, said machine being supplyable by a converter by actuating signals to several electric phases; wherein the machine is connected to the converter and is supplied with a plurality of polyphase test signals via a polyphase electric winding of the machine at a plurality of stator angles with substantially no movement of the rotor during supply of a respective test signal;

measuring causal consequences of a respective test signal at a respective angular stator position;

determining a measuring value (r1, r2; $z_i$) from the measured causal consequences of the respective test signal at the respective angular stator position of the stator of the connected polyphase machine;

determining a plurality of such measuring values and establishing a comparison function;

wherein electric angles of several of said test signals are changed relative to the mechanical angular positions (φ) of the rotor in order to detect different positions of the rotor with respect to the angles of the test signals from the stator;

to prepare an allocation of a machine type to the connected machine.

* * * * *